United States Patent
Hu

(10) Patent No.: US 9,882,015 B2
(45) Date of Patent: Jan. 30, 2018

(54) TRANSISTORS, SEMICONDUCTOR DEVICES, AND ELECTRONIC DEVICES INCLUDING TRANSISTOR GATES WITH CONDUCTIVE ELEMENTS INCLUDING COBALT SILICIDE

(71) Applicant: Micron Technology, Inc., Boise, ID (US)

(72) Inventor: Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/182,794

(22) Filed: Feb. 18, 2014

(65) Prior Publication Data

US 2014/0159172 A1 Jun. 12, 2014

Related U.S. Application Data

(62) Division of application No. 11/636,192, filed on Dec. 8, 2006, now Pat. No. 8,652,912.

(51) Int. Cl.
*H01L 21/336* (2006.01)
*H01L 29/49* (2006.01)
(Continued)

(52) U.S. Cl.
CPC .... *H01L 29/4975* (2013.01); *H01L 21/28273* (2013.01); *H01L 27/105* (2013.01);
(Continued)

(58) Field of Classification Search
CPC ..... H01L 21/823814; H01L 21/823835; H01L 21/28273; H01L 27/115; H01L 29/7881;
(Continued)

(56) References Cited

U.S. PATENT DOCUMENTS 5,902,129 A  5/1999  Yoshikawa et al.
6,054,355 A  4/2000  Inumiya et al.
(Continued)

FOREIGN PATENT DOCUMENTS

JP  03138983 A  6/1991
JP  11074219 A  3/1999
(Continued)

OTHER PUBLICATIONS

Bae, Jong-Uk, et al., Formation of CoSi(2) on Various Polycrystalline Silicon Structures and Its Effects on Thermal Stability, Journal of the Electrochemical Society, vol. 147, No. 4, 2000, pp. 1551-1554.
(Continued)

*Primary Examiner* — Thanh Y Tran
(74) *Attorney, Agent, or Firm* — TraskBritt

(57) ABSTRACT

A method for fabricating a transistor gate with a conductive element that includes cobalt silicide includes use of a sacrificial material as a place-holder between sidewall spacers of the transistor gate until after high temperature processes, such as the fabrication of raised source and drain regions, have been completed. In addition, semiconductor devices (e.g., DRAM devices and NAND flash memory devices) with transistor gates that include cobalt silicide in their conductive elements are also disclosed, as are transistors with raised source and drain regions and cobalt silicide in the transistor gates thereof. Intermediate semiconductor device structures that include transistor gates with sacrificial material or a gap between upper portions of sidewall spacers are also disclosed.

24 Claims, 11 Drawing Sheets

(51) Int. Cl.
*H01L 21/28* (2006.01)
*H01L 27/105* (2006.01)
*H01L 27/115* (2017.01)
*H01L 27/11521* (2017.01)
*H01L 27/108* (2006.01)

(52) U.S. Cl.
CPC ...... *H01L 27/10891* (2013.01); *H01L 27/115* (2013.01); *H01L 27/11521* (2013.01); *H01L 27/10805* (2013.01)

(58) Field of Classification Search
CPC ......... H01L 29/42328; H01L 29/66825; H01L 27/11521
See application file for complete search history.

(56) References Cited

U.S. PATENT DOCUMENTS

| | | | |
|---|---|---|---|
| 6,060,387 A | 5/2000 | Shepela et al. | |
| 6,235,627 B1 | 5/2001 | Nakajima | |
| 6,388,327 B1 | 5/2002 | Giewont et al. | |
| 6,392,302 B1* | 5/2002 | Hu | H01L 21/28061 257/754 |
| 6,472,265 B1 | 10/2002 | Hsieh | |
| 6,515,338 B1 | 2/2003 | Inumiya et al. | |
| 6,524,904 B1* | 2/2003 | Segawa | H01L 21/823842 257/E21.637 |
| 6,562,716 B2 | 5/2003 | Hashimoto et al. | |
| 6,570,214 B1 | 5/2003 | Wu | |
| 6,664,592 B2 | 12/2003 | Inumiya et al. | |
| 6,713,834 B2 | 3/2004 | Mori et al. | |
| 6,737,716 B1 | 5/2004 | Matsuo et al. | |
| 6,806,132 B2 | 10/2004 | Mori et al. | |
| 6,818,944 B2* | 11/2004 | Lee | H01L 27/115 257/314 |
| 6,930,361 B2 | 8/2005 | Inaba | |
| 6,995,081 B2 | 2/2006 | Vaartstra | |
| 7,030,012 B2 | 4/2006 | Divakaruni et al. | |
| 7,061,069 B2 | 6/2006 | Mori et al. | |
| 7,135,401 B2 | 11/2006 | Tran et al. | |
| 7,205,227 B2 | 4/2007 | Tran et al. | |
| 7,265,428 B2 | 9/2007 | Aoyama | |
| 7,400,016 B2 | 7/2008 | Inaba | |
| 7,420,259 B2 | 9/2008 | Mori et al. | |
| 7,470,961 B2 | 12/2008 | Aiso | |
| 7,498,641 B2 | 3/2009 | Wang et al. | |
| 8,722,489 B2* | 5/2014 | Hsu | H01L 21/28273 257/264 |
| 2001/0003056 A1 | 6/2001 | Hashimoto et al. | |
| 2001/0006832 A1* | 7/2001 | Bae | H01L 21/823835 438/199 |
| 2002/0079548 A1* | 6/2002 | Hu | H01L 21/28061 257/412 |
| 2002/0093073 A1 | 7/2002 | Mori et al. | |
| 2002/0164866 A1* | 11/2002 | Bae | H01L 21/28052 438/595 |
| 2002/0190284 A1 | 12/2002 | Murthy et al. | |
| 2003/0107088 A1 | 6/2003 | Inumiya et al. | |
| 2003/0207556 A1 | 11/2003 | Weimer et al. | |
| 2004/0080020 A1 | 4/2004 | Mod et al. | |
| 2004/0121526 A1 | 6/2004 | Yamamoto | |
| 2004/0169221 A1 | 9/2004 | Ko et al. | |
| 2004/0229422 A1 | 11/2004 | Mori et al. | |
| 2004/0232515 A1 | 11/2004 | Mori et al. | |
| 2005/0009265 A1 | 1/2005 | Yoo et al. | |
| 2005/0070082 A1* | 3/2005 | Kammler et al. | 438/592 |
| 2005/0079695 A1* | 4/2005 | Carriere | H01L 21/28097 438/592 |
| 2005/0156238 A1 | 7/2005 | Wen et al. | |
| 2005/0156248 A1* | 7/2005 | Chen | H01L 21/84 257/353 |
| 2005/0157549 A1 | 7/2005 | Mokhlesi et al. | |
| 2005/0199943 A1* | 9/2005 | Nakagawa | H01L 29/7923 257/317 |
| 2005/0199963 A1 | 9/2005 | Aoyama | |
| 2005/0250315 A1 | 11/2005 | Tran et al. | |
| 2006/0006476 A1* | 1/2006 | Biery | H01L 21/82342 257/382 |
| 2006/0019445 A1* | 1/2006 | Chen | 438/257 |
| 2006/0081930 A1 | 4/2006 | Maegawa et al. | |
| 2006/0160296 A1 | 7/2006 | Tran et al. | |
| 2006/0163637 A1 | 7/2006 | Mori et al. | |
| 2006/0199324 A1 | 9/2006 | Yu et al. | |
| 2007/0007571 A1* | 1/2007 | Lindsay et al. | 257/306 |
| 2008/0135903 A1 | 6/2008 | Hu | |

FOREIGN PATENT DOCUMENTS

| | | |
|---|---|---|
| JP | 11074527 A | 3/1999 |
| JP | 2001077323 A | 3/2001 |
| JP | 2001168059 A | 6/2001 |
| JP | 2002203919 A | 7/2002 |
| JP | 2004152973 A | 5/2004 |
| JP | 2004200550 A | 7/2004 |
| JP | 2004273556 A | 9/2004 |
| JP | 2004273559 A | 9/2004 |
| JP | 2004349471 A | 12/2004 |
| JP | 2005260228 A | 9/2005 |
| JP | 2005294799 A | 10/2005 |
| JP | 2005328079 A | 11/2005 |
| JP | 2006148064 A | 6/2006 |
| JP | 2006310884 A | 11/2006 |
| JP | 2006319365 A | 11/2006 |
| JP | 2006324527 A | 11/2006 |
| JP | 2007536740 A | 12/2007 |
| TW | 448508 B | 8/2001 |
| TW | 531795 B | 5/2003 |
| WO | 2005109491 A1 | 11/2005 |

OTHER PUBLICATIONS

Chen, L.J., "Metal Silicides: An Integral Part of Microelectronics," The Journal of the Minerals, Metals and Materials Society, Sep. 2005, pp. 24-30, vol. 57, No. 9 (11 pages).
Froment et. al, "Nickel vs. Cobalt Silicide Integration for sub-50nm CMOS," European Solid-State Device Research, Sep. 16-18, 2003, ESSDERC '03, 33rd Conference, pp. 215-218 (4 pages).
International Preliminary Report on Patentability for International Application No. PCT/US2007/086487, dated Jun. 10, 2009, (10 pages).
International Search Report for International Application No. PCT/US2007/086487, dated Jul. 16, 2008, (6 pages).
International Written Opinion for International Application No. PCT/US2007/086487, dated Jul. 16, 2008, (9 pages).
Invitation to Pay Additional Fees, Form PCT/ISA/206, dated Apr. 2008, in PCT International Application No. PCT/US2007/086487, (5 pages).
Litwiller, Dave, "CCD vs. CMOS: Facts and Fiction, Choosing an imager means considering not only the chip, but also its manufacturer and how your application will evolve," Photonics Spectra, Jan. 2001, (4 pages).
Merriam-Webster Dictionary, Definition of "amorphous" accessed Nov. 15, 2010, from www.merriam-webster.com, (2 pages).
Taiwan Search Report, dated Jul. 21, 2012, for Taiwan Application No. 096146873, (1 page).
Wikipedia, "CMOS," http://www.en.wikipedia.org/wiki/Cmos, Oct. 18, 2006, Wikipedia Encyclopedia, (4 pages).
"Silicides," http://www.processmaterials.com/silicides.html, 2005, Process Materials Inc., (2 pages).
Japanese Office Action for Japanese Application No. 2014-046036, (dated Dec. 16, 2014), 13 pages.
Search Report for Taiwan Application No. 102115754, (dated Jan. 23, 2015), 1 page.
Taiwan Office Action and Search Report for Taiwanese Patent Application No. 104133084, (search report dated Jul. 20, 2016), 14 pages including translation.
Japanese Notification of Reasons for Refusal for Japanese Application No. 2009-540447 dated May 22, 2012, 7 pages.

(56) References Cited

OTHER PUBLICATIONS

Japanese Notification of Reasons for Refusal for Japanese Application No. 2009-540447 dated Oct. 2, 2012, 6 pages.
Japanese Search Report for Japanese Application No. 2009-540447 dated May 16, 2012, 56 pages.

* cited by examiner

TRANSISTORS, SEMICONDUCTOR DEVICES, AND ELECTRONIC DEVICES INCLUDING TRANSISTOR GATES WITH CONDUCTIVE ELEMENTS INCLUDING COBALT SILICIDE

CROSS-REFERENCE TO RELATED APPLICATION

This application is a divisional of U.S. patent application Ser. No. 11/636,192, filed Dec. 8, 2006, now U.S. Pat. No. 8,652,912, issued Feb. 18, 2014, the disclosure of which is hereby incorporated in its entirety herein by this reference.

TECHNICAL FIELD

The present invention, in various embodiments, relates generally to methods for fabricating gates of transistors and, more specifically, to methods for fabricating gates that include conductive elements that comprise cobalt silicide, and associated structures. In particular, embodiments of the present invention relate to methods and associated structures in which high temperature processes, such as the fabrication of raised source and drain regions of a transistor, are completed before cobalt silicide features are fabricated.

BACKGROUND

Transistor gates are used in a variety of different types of semiconductor devices. A number of different types of conductive materials have been used to form the elements, or lines, of transistor gates. Tungsten silicide is an example of such a conductive material, and is widely used in semiconductor devices that employ current state-of-the-art technologies.

As feature dimensions of semiconductor device structures decrease, limitations on the materials that are used therein become ever more apparent. For example, at line widths of about 55 nm and less, the bulk electrical resistance of tungsten silicide ($WSi_x$) increases to about 175 µΩ to about 250 µΩ. Bulk electrical resistances of this magnitude are undesirable, as they decrease the rate at which conductive lines transmit electrical signals and may cause the conductive lines and other elements of a semiconductor device to be heated to temperatures that may adversely affect the performance, structural integrity, and reliability of the semiconductor device.

Cobalt disilicide ($CoSi_2$) has a much lower bulk resistance than tungsten silicide (e.g., about one tenth or less of the bulk resistance of tungsten silicide), but does not retain its quality when exposed to high temperatures, as are encountered during many semiconductor device fabrication processes. For example, the epitaxial processes that are required to form "raised" (i.e., at the same elevation or a higher elevation than a gate oxide) source and drain regions adjacent to transistor gates of some types of transistors, such as those of dynamic random access memory (DRAM) devices and NAND flash memory devices, require temperatures of 900° C. or more. As a consequence of the relatively low thermal stability of cobalt disilicide, it could not be used in transistors with raised source and drain regions or other structures in which conductive elements have conventionally been fabricated before all high temperature processes have been completed.

Accordingly, there is a need for processes that facilitate the use of lower bulk resistance conductive materials in the fabrication of conductive features of semiconductor devices with ever-decreasing feature dimensions, as well as for semiconductor device structures with conductive features that are formed with low bulk resistance materials.

BRIEF DESCRIPTION OF THE DRAWINGS

In the drawings, which depict various features of different aspects of the present invention:

FIGS. 1 through 24 depict an embodiment of a process for fabricating a transistor of a semiconductor device structure, in which a gate of the transistor includes a conductive element formed at least partially from cobalt silicide, in which FIG. 1 illustrates a section of a semiconductor device structure under fabrication, FIGS. 2 through 5 show an enlarged, smaller section of a semiconductor device structure under fabrication, and FIGS. 6 through 24 depict an even more enlarged, smaller section of a semiconductor device structure under fabrication;

DETAILED DESCRIPTION

In one embodiment, the present invention includes methods for fabricating transistor gates, or "word lines," for semiconductor devices. Such a method includes the use of a sacrificial material as a place-holder until high temperature processes have been completed. As a specific but non-limiting example, the sacrificial material may act as a place-holder between sidewall spacers of a transistor gate until after high temperature epitaxial deposition processes are used to form raised source and drain regions adjacent to opposite sides of the transistor gate. Once high temperature processes have been performed, the sacrificial material may be removed and replaced with cobalt silicide.

According to another embodiment, the present invention includes structures that include cobalt silicide conductive features. One nonlimiting example of such a structure is a transistor of a semiconductor device, such as a DRAM device, a NAND flash memory device, as well as any other transistor that includes raised source and drain regions, and semiconductor devices including such structures.

Embodiments of intermediate semiconductor device structures that include transistor gate structures with sacrificial material or a gap between upper portions of sidewall spacers thereof are also within the scope of the present invention.

Other features and advantages of the present invention will become apparent to those in the art through consideration of the ensuing description, the accompanying drawings, and the appended claims.

One embodiment of a method for fabricating a transistor gate with a conductive element that includes cobalt silicide is shown in FIGS. 1 through 24.

Figure 1:
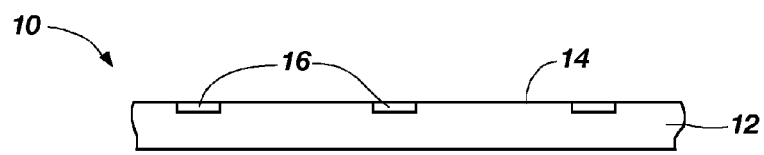

In FIG. 1, a semiconductor device structure 10, including a semiconductor substrate 12 with an active surface 14 and isolation structures 16 (e.g., shallow trench isolation (STI) structures, etc.) formed or fabricated (by any suitable manner known in the art) on or in active surface 14 is depicted.

Figure 2:
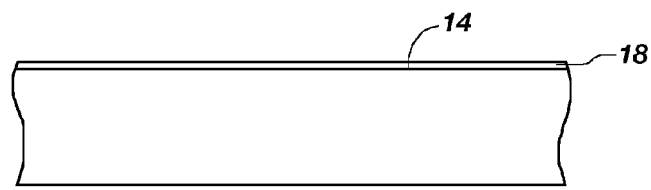
Figure 3:
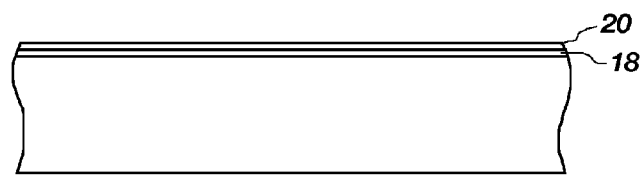

A gate oxide 18 is formed over active surface 14 by known processes, as shown in FIG. 2. As shown in FIG. 3, a polysilicon layer 20 is then deposited over gate oxide 18 and active surface 14 by any known process (e.g., chemical vapor deposition (CVD), etc.).

Figure 4:
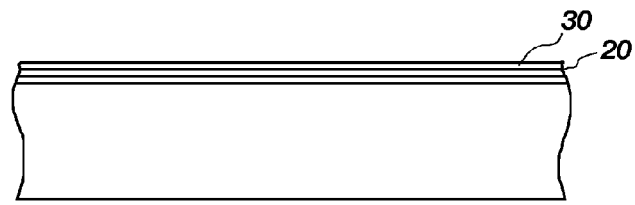

Thereafter, as illustrated in FIG. 4, a layer 30 of tantalum silicide (TaSi$_2$) is formed on or over polysilicon layer 20. Tantalum silicide layer 30 may be formed by any suitable process known in the art, including, but not limited to, a physical vapor deposition (PVD) process (e.g., sputtering). Without limiting the scope of the present invention, tantalum silicide layer 30 may be formed to a thickness of about 200 Å to about 300 Å.

Figure 5:

A silicon layer 40 is then formed on or over tantalum silicide layer 30, as depicted in FIG. 5. Silicon layer 40, which may comprise amorphous silicon, or "α-Si," may be formed by any appropriate, known process (e.g., PVD). By way of non-limiting example, silicon layer 40 may have a thickness of about 300 Å to about 600 Å.

Figure 6:
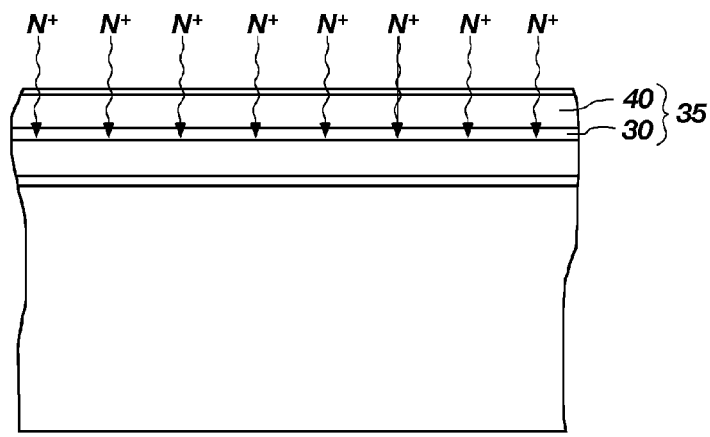

Once the "stack" 35 of tantalum silicide layer 30 and silicon layer 40 has been formed, nitrogen may be implanted through silicon layer 40 and into tantalum silicide layer 30, as illustrated in FIG. 6. Such implantation may be effected by known processes, such as by way of a $N_{14}^+$ implantation process is effected at a density of $5\times10^{15}$ (or 5E15) particles per/cm$^2$ at 15 KeV (i.e., a $N_{14}^+$ 5E15 15 KeV implantation process is effected).

Figure 7:
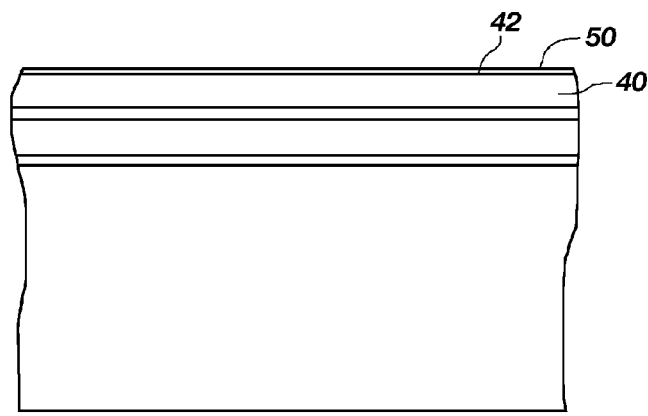

As FIG. 7 shows, once nitrogen implantation is complete, a thin oxide layer 50 may be formed on an exposed surface 42 of silicon layer 40. As an example, and not to limit the scope of the present invention, thin oxide layer 50 may have a thickness of about 30 Å. Any known process (e.g., high temperature oxidation (HTO), in-situ steam-generated (ISSG) oxide, etc.) may be used to form (e.g., grow, deposit, etc.) thin oxide layer 50 onto exposed surface 42 of silicon layer 40.

Figure 8:
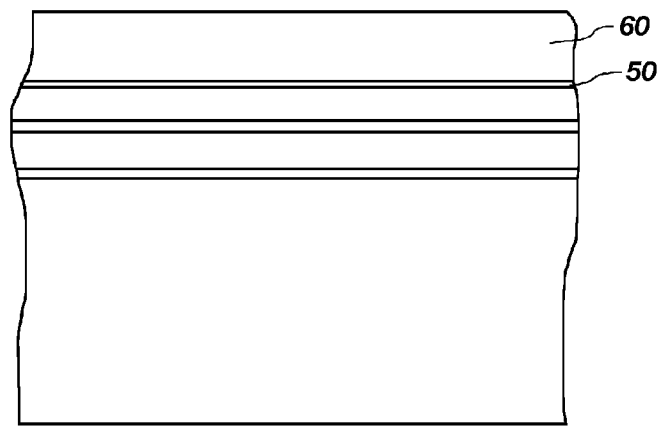

As depicted in FIG. 8, a "sacrificial layer 60" may be formed on or over oxide layer 50. Sacrificial layer 60 may comprise n-doped polysilicon, silicon nitride, or any other suitable material, and may be formed by suitable, known processes (e.g., CVD, etc.). Sacrificial layer 60 may have a thickness of about 1,000 Å.

Figure 9:
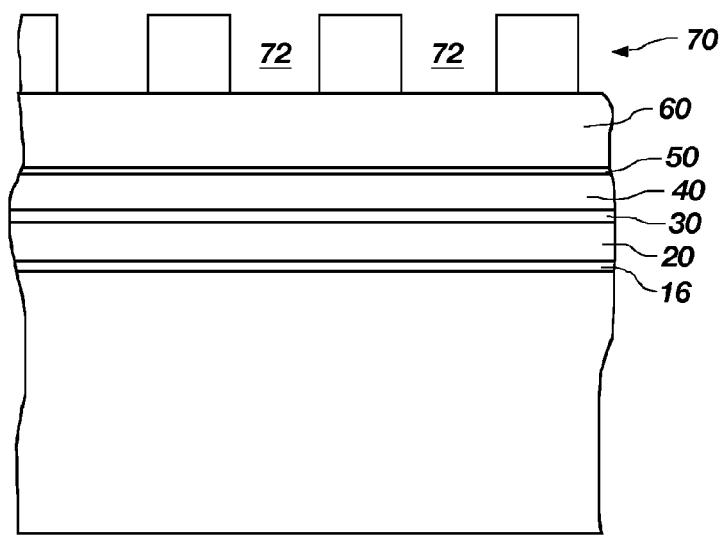
Figure 10:
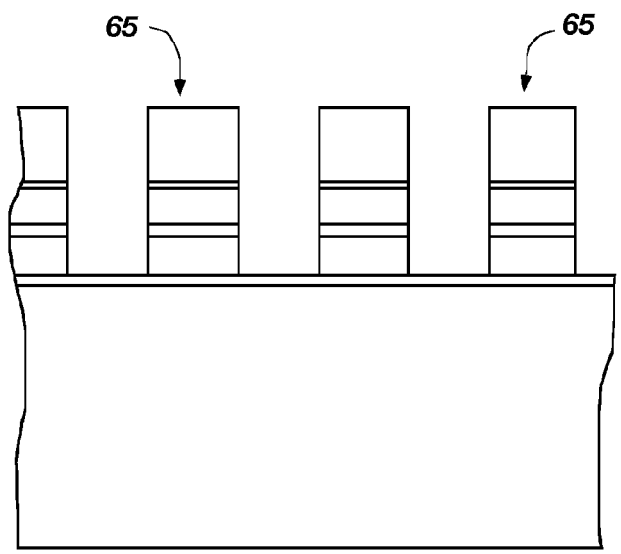

Individual gate stacks 65 may then be formed, as shown in FIGS. 9 and 10. In forming individual gate stacks 65, portions of sacrificial layer 60, oxide layer 50, silicon layer 40, silicide layer 30, and polysilicon layer 20 are removed by known processes. As an example, a mask 70 (e.g., a carbon-based (e.g., transparent carbon) mask, a hard mask, a photomask, etc.) may be formed on or over sacrificial layer 60 by known processes (see FIG. 9), then serve as a pattern through which material removal is effected. The materials of layers 60, 50, 40, 30, and 20 may be removed, for example, by use of one or more suitable etchants (e.g., dry etchants) under process conditions that provide the desired results (e.g., aspect ratios, sidewall shape and orientation, etc.). Material of layer 60 may be removed through apertures 72 in mask 70, while material of each underlying layer 50, 40, 30, 20 may be removed through apertures 72 of mask 70 and/or through openings that are formed in one or more overlying layers 60, 50, 40, 30 as material is removed from the overlying layers.

Figure 11:
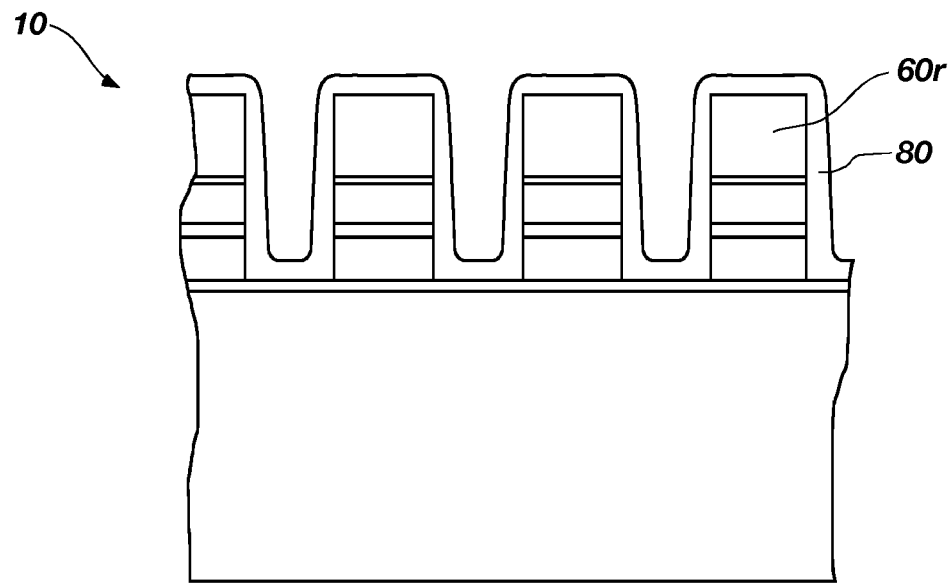
Figure 12:
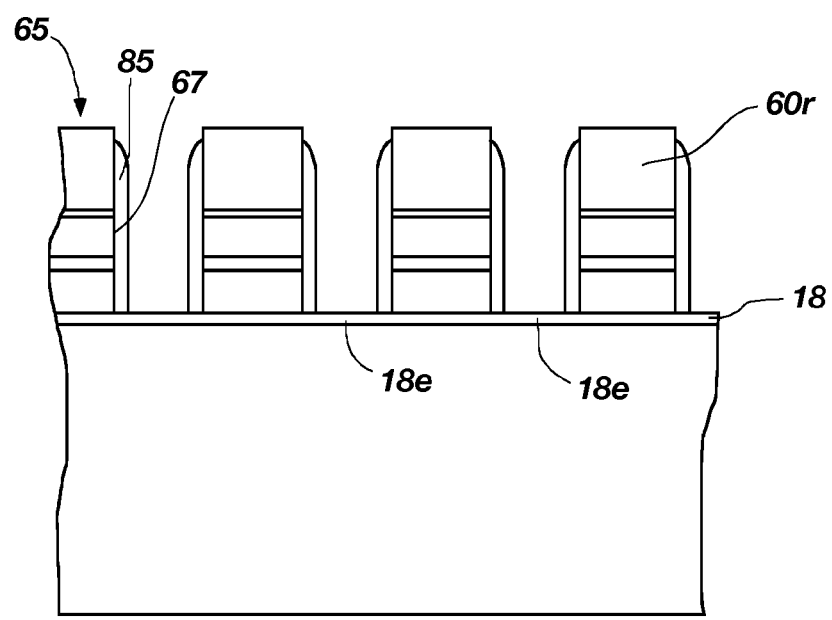

With reference to FIGS. 11 and 12, sidewall spacers 85 are formed on lateral edges 67 of each gate stack 65 by known processes. For example, a layer 80 of a suitable dielectric material, i.e., a material that may be removed selectively with respect to the material of remaining portions 60r of sacrificial layer 60 (FIGS. 8 and 9) (e.g., silicon nitride, silicon oxide, etc., in the case of a polysilicon sacrificial layer 60, a silicon oxide spacer formed by decomposition of tetraethylorthosilicate (TEOS) in the case of a silicon nitride sacrificial layer 60, etc.), may be formed (e.g., blanket deposited) over semiconductor device structure 10, as shown in FIG. 11. Thereafter, as shown in FIG. 12, a spacer etch of a suitable, known type may be effected to define sidewall spacers 85 from portions of layer 80 that are laterally adjacent to lateral edges 67 of gate stacks 65.

Figure 13:
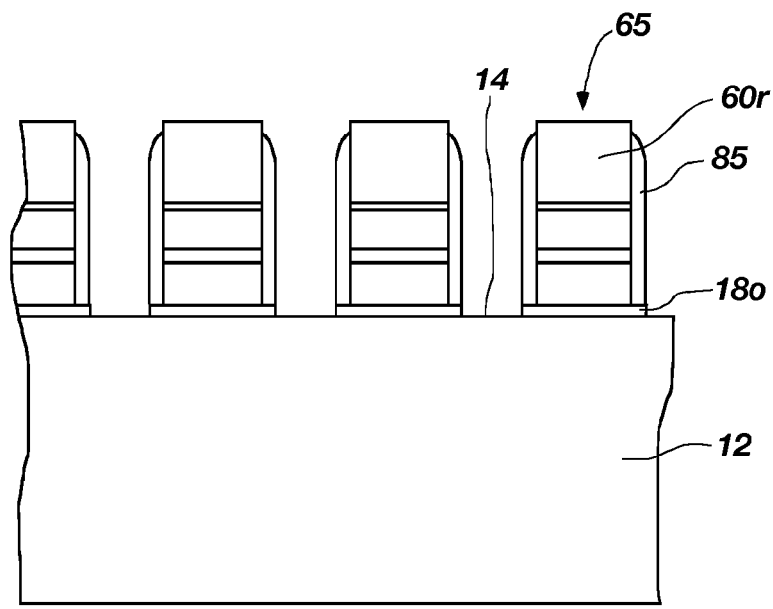

Next, as depicted in FIG. 13, material of gate oxide layer 18 is removed from regions 18e (FIG. 12) of layer 18 that are exposed between adjacent sidewall spacers 85 (FIG. 12) to form individual gate oxide 18o structures. Removal of the material of regions 18e of gate oxide layer 18 may be effected by known processes, such as by use of an etchant that removes the material of gate oxide layer 18 with selectivity over the materials of remaining portions 60r of sacrificial layer 60 (FIGS. 8 and 9) and sidewall spacer 85. Upon removing exposed portions of gate oxide layer 18, portions of active surface 14 of substrate 12 that are located laterally between gate stacks 65 are exposed.

Figure 14:
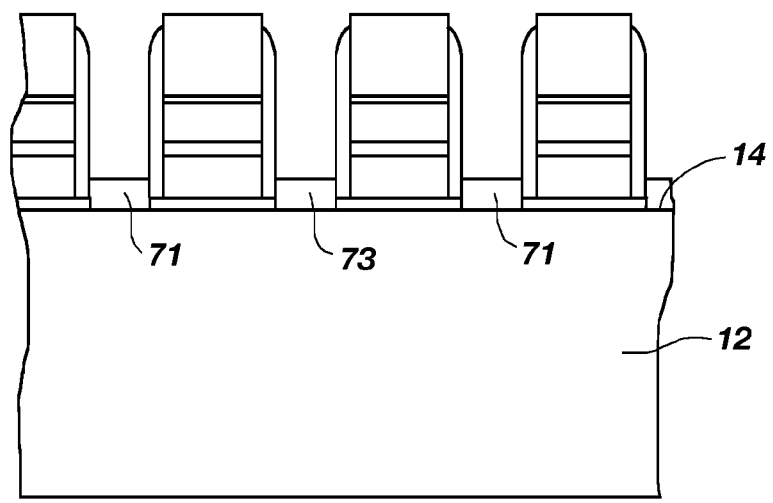

Source and drain regions 71 and 73, respectively, may then be formed on or in the newly exposed regions of active surface 14 of substrate 12, between adjacent gate stacks 65, as FIG. 14 illustrates. The formation of source and drain regions 71 and 73 may be effected by known processes, including, without limitation, deposition, masking, and etching processes to remove silicon from undesired locations. Without limiting the scope of the present invention, known epitaxial processes may be used to form source and drain regions 71 and 73 that protrude from, or are raised relative to, active surface 14 of substrate 12.

Figure 15:
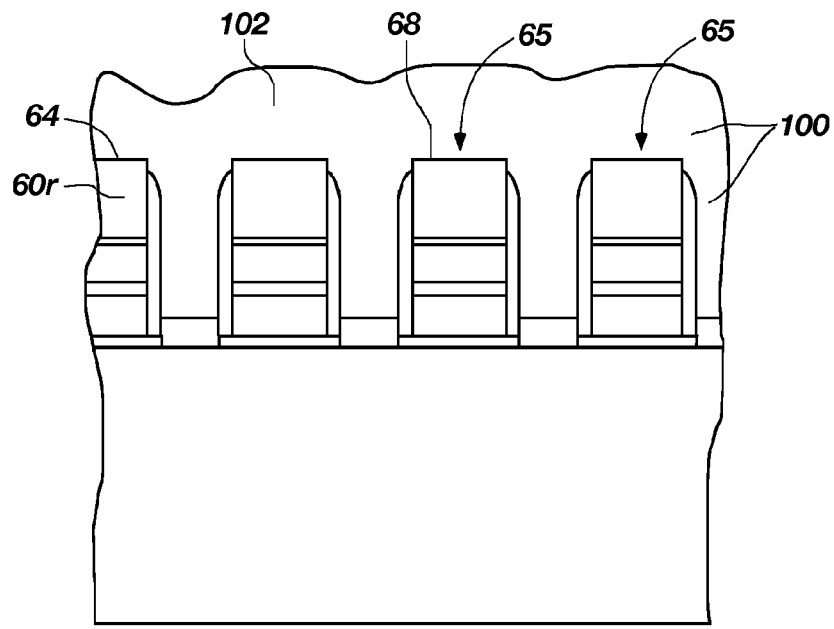

A dielectric layer 100 may then be formed to fill the spaces between adjacent gate stacks 65, as shown in FIG. 15. Dielectric layer 100, which may comprise a doped silicon dioxide, or glass (e.g., borophosphosilicate glass (BPSG), phosphosilicate glass (PSG), borosilicate glass (BSG), etc.), may be formed by known processes (e.g., CVD, spin-on glass, etc.).

Figure 16:
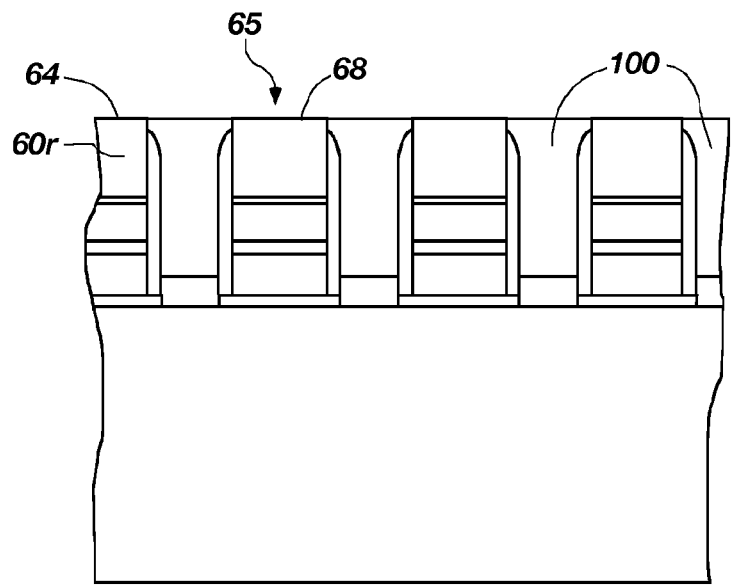

Regions 102 of the resulting dielectric layer 100 that have elevations that exceed uppermost surfaces 68 of gate stacks 65 (e.g., a top surface 64 of remaining portions 60r of sacrificial layer 60) may be removed, as depicted in FIG. 16. Removal of the material of regions 102 may be carried out by known processes. An example of such a process is chemical-mechanical polishing (CMP). The CMP process may be configured to remove the material of dielectric layer 100 at a faster rate than an exposed material of gate stacks 65 (e.g., the polysilicon of remaining portions 60r of sacrificial layer 60 (FIGS. 8 and 9)) is removed, or "with selectivity over" the exposed material of gate stacks 65. For example, a so-called "stop-on-silicon" (SOS) polishing process may be used.

If any silicon from the epitaxial deposition process is present on top surfaces 64 of remaining portions 60r of sacrificial layer 60, it may be removed by any known, suitable process, such as a wet etch (e.g., that is timed to remove about 300 Å of material).

Figure 17:
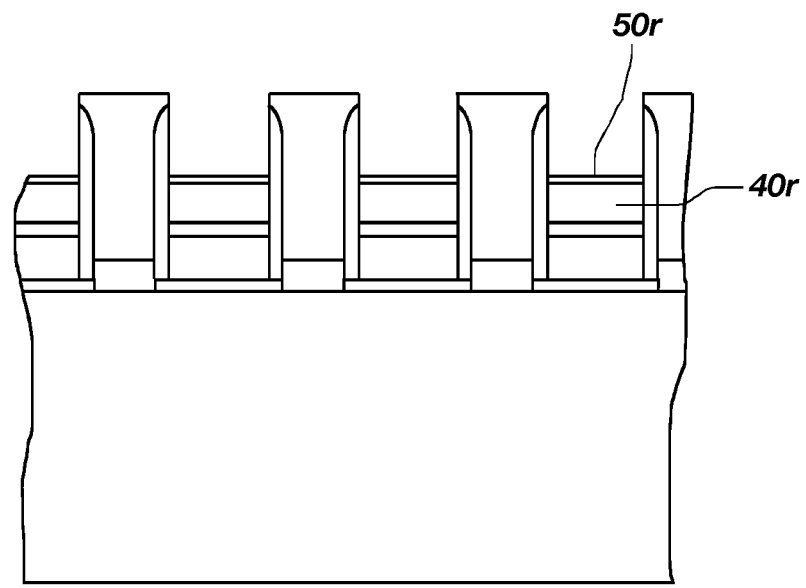

Once remaining portions 60r of sacrificial layer 60 (FIGS. 8 and 9) are exposed through dielectric layer 100 and any silicon present on upper surfaces 64 of remaining portions 60r, remaining portions 60r of sacrificial layer 60 may be removed, as shown in FIG. 17. Remaining portions 60r (FIG. 16) may be removed by known processes. By way of non-limiting example, remaining portions 60r may be removed by use of an etchant (e.g., tetramethylammonium hydroxide (TMAH), a dry process for removing polysilicon, etc.) that removes the material of sacrificial layer 60 (e.g., polysilicon) with selectivity over the materials of dielectric layer 100 and sidewall spacers. Alternatively, the remaining portions 60r may be removed through a mask (not shown).

Figure 18:
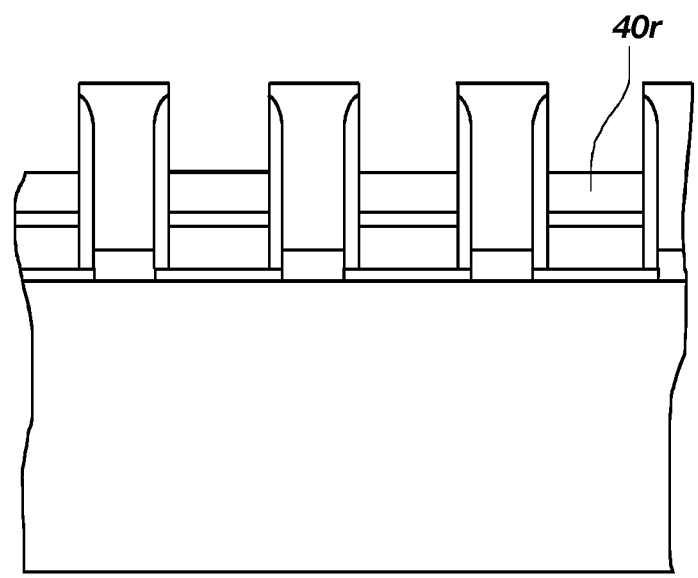

Remaining portions 50r of thin oxide layer 50 (see FIGS. 8 and 9) may also be removed, as shown in FIG. 18. Removal of remaining portions 50r may be effected by any suitable, known process, and with selectivity over the N-implanted α-Si of remaining portions 40r of silicon layer 40 (see FIGS. 8 and 9).

Figure 19:
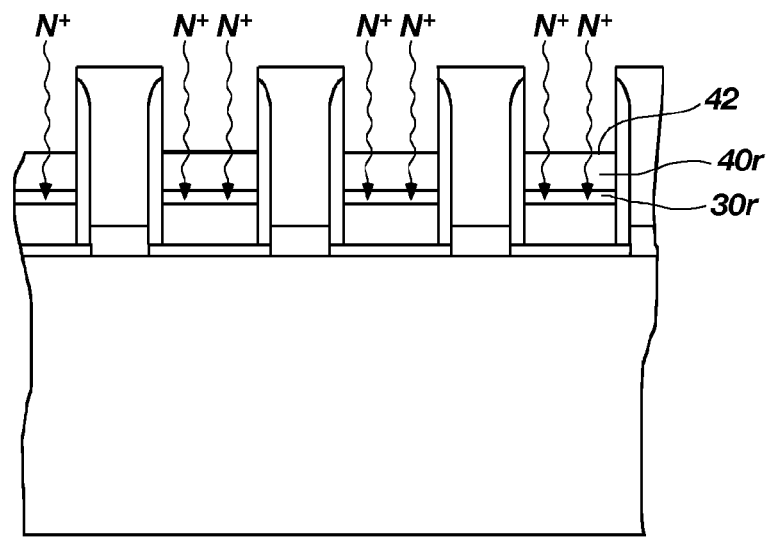

Thereafter, as illustrated in FIG. 19, remaining portions 30r of tantalum silicide layer 30 (see FIGS. 8 and 9) may again be subjected to nitrogen implant processes through the newly exposed remaining portions 40r of silicon layer 40 (see FIGS. 8 and 9). Without limiting the scope of the present invention, a known $N_{14}^+$ 5E15 15KeV implantation process may be employed. Such implantation may be useful for improving the barrier properties of remaining portions 30r of tantalum silicide layer 30 (FIGS. 8 and 9).

At this point in the process flow, any native oxide that has been formed on the exposed surfaces 42 of remaining portions 40r of silicon layer 40 (see FIGS. 8 and 9) may be removed by any suitable preclean process (e.g., use of a wet etchant).

Figure 20:
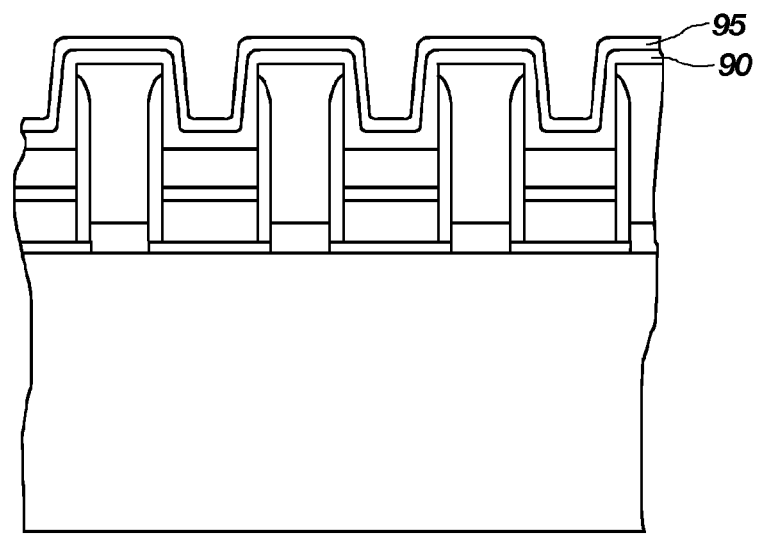

FIG. 20 shows the subsequent, successive deposition of a cobalt layer 90 and a titanium or titanium nitride layer 95. Known processes (e.g., chemical vapor deposition (CVD), atomic layer deposition (ALD), physical vapor deposition (PVD) (e.g., sputtering), etc.) may be used to form cobalt layer 90 and titanium layer 95. When low pressure sputtering (ALPS) processes are used to form cobalt layer 90, cobalt layer 90 may have good step coverage (e.g., about 80% bottom step coverage on the largest critical dimensions (CD) of the transistor gate to about 60% bottom step coverage on the smallest CD of the transistor gate). Titanium or titanium nitride layer 95 prevents oxidation of cobalt layer 90 during subsequent processing.

Figure 21:
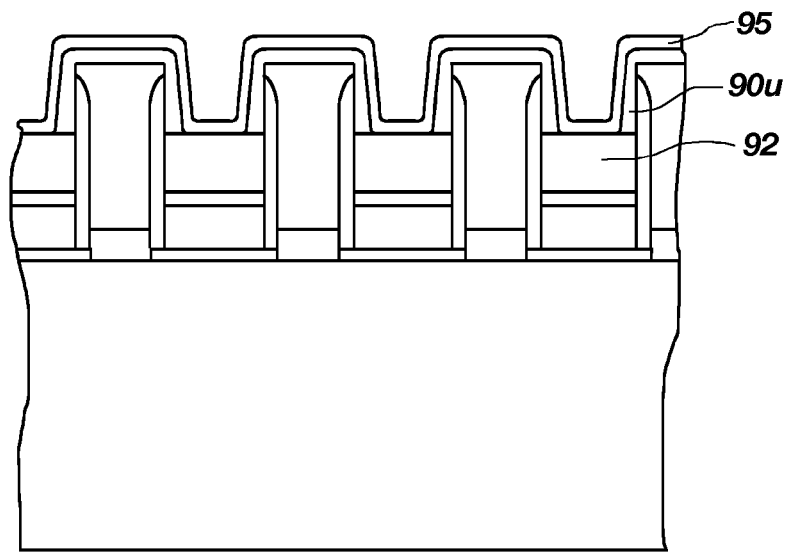

After cobalt layer 90 and titanium or titanium nitride layer 95 have been formed, suitable, known rapid thermal processing (RTP) techniques, may be used to anneal portions of cobalt layer 90 to adjacent, contacted remaining portions 40r of silicon layer 40 (see FIGS. 8 and 9), as depicted in FIG. 21. Without limiting the scope of the present invention such RTP, which may also be referred to as a "first RTP" or as a "first anneal," may be effected at a temperature of about 450° C. to about 550° C. for a duration of about thirty seconds in a nitrogen ($N_2$) environment. The result of the RTP is cobalt monosilicide (CoSi) 92, which is also referred to herein as "cobalt silicide."

Figure 22:
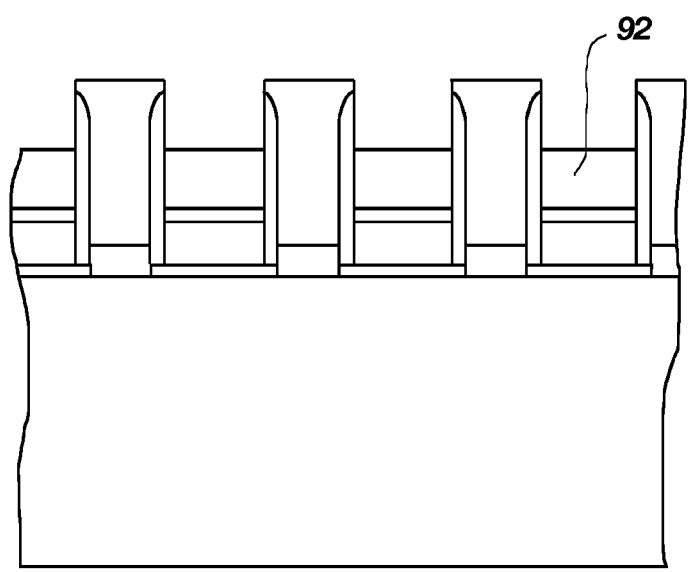

Once annealing has taken place, titanium layer 95 and unreacted regions 90u of cobalt layer 90 (see FIG. 21) may be removed, or "stripped," as shown in FIG. 22. Known removal processes (e.g., etching processes, etc.) may be used. As a nonlimiting example, titanium layer 95 and unreacted regions 90u of cobalt layer 90 may be removed in a so-called "piranha" environment (e.g., at a temperature of about 90° C. for a duration of about 90 seconds), with hot sulfuric acid (e.g., at a temperature of about 90° C. to about 100° C. for a duration of about 90 seconds), or with any other suitable etchants, strippers, or solvents. The process that is used to remove unreacted regions 90u may have selectivity for cobalt over cobalt silicide.

After titanium layer 95 and unreacted regions 90u of cobalt layer 90 (see FIG. 21) have been removed, further RTP may be performed on the cobalt monosilicide 92. Such RTP may also be referred to as a "second RTP" or as a "second anneal." Without limiting the scope of the present invention, this RTP may include exposing cobalt monosilicide 92 to a temperature of about 750° C. to about 850° C. in a nitrogen ($N_2$) environment for a duration of about thirty seconds. The result is cobalt disilicide ($CoSi_2$) or, simply "cobalt silicide."

Figure 23:
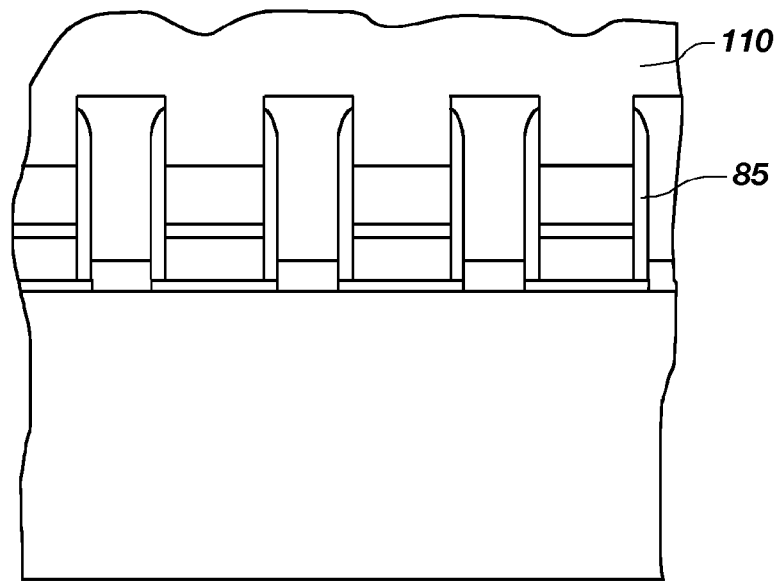
Figure 24:
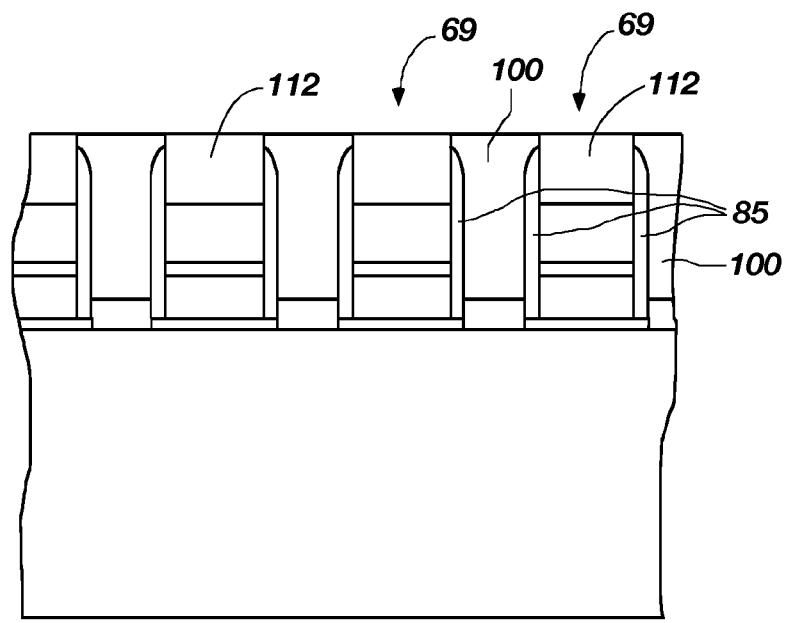

As depicted in FIGS. 23 and 24, transistor gate caps 112 may be formed by blanket depositing a layer 110 of a suitable dielectric material (e.g., silicon nitride when sidewall spacers 85 are formed from silicon nitride, any suitable interlayer dielectric (ILD) material, glass (e.g., BPSG), or the like when sidewall spacers 85 comprise silicon dioxide, etc.), then removing (e.g., by CMP, wet etch processes, etc.) regions of layer 110 that are not located between sidewall spacers 85.

Figure 25:
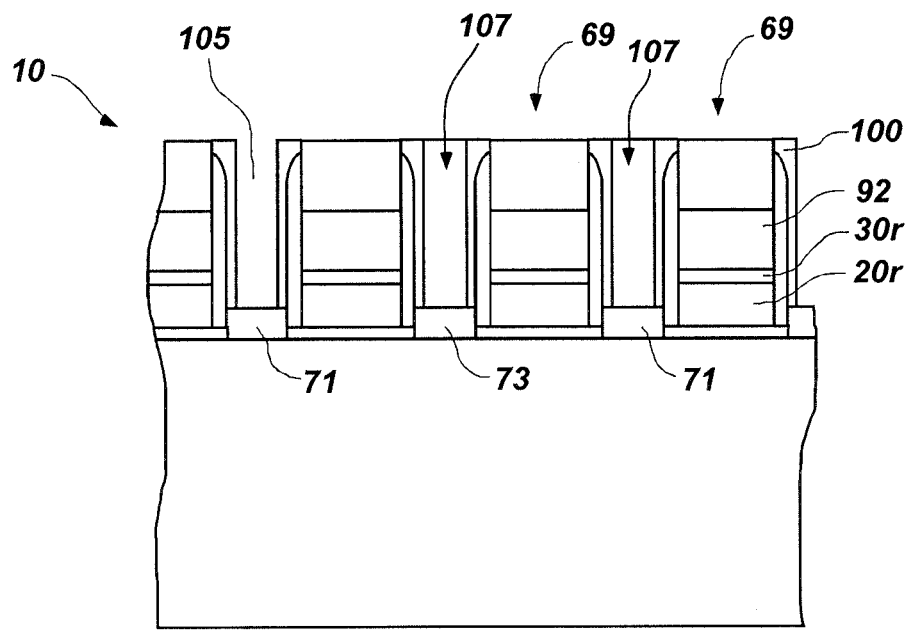
FIG. 25 illustrates an embodiment of a semiconductor device structure that includes a transistor with a gate including a conductive element that is partially formed from cobalt silicide.

Remaining regions of dielectric layer 100, or merely portions thereof, as shown in FIG. 25, may then be removed from between sidewall spacers 85 of adjacent transistor gates 69 to form contact holes 105 that expose source and drain regions 71 and 73. Further processing of semiconductor device structure 10, including, but not limited to, the formation of contact plugs 107 (e.g., polysilicon plugs, tungsten plugs, etc.) over source and drain regions 71 and 73, may then be conducted in any suitable manner known in the art to fabricate complete semiconductor devices. For simplicity, two contact plugs 107 are shown in FIG. 25 with the understanding that a contact plug 107 may be present in the remaining contact hole 105.

With continued reference to FIG. 25, a transistor gate 69 that results from the processes described herein may include a conductive element with a polysilicon layer 20r, an about 200 Å to about 300 Å thick tantalum silicide layer 30r, and an about 300 Å to about 600 Å thick cobalt silicide layer 92. As shown, a contact hole 105 may be formed (e.g., by suitable mask and etch processes) between adjacent transistor gates 69 to expose a source or drain region 71, 73 located laterally between adjacent transistor gates 69.

Figure 26:
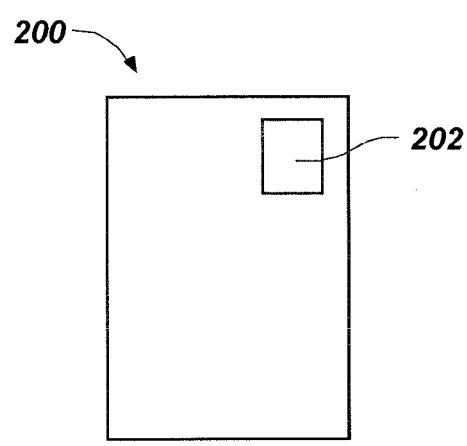
FIG. 26 is a schematic representation of an embodiment of an electronic device that includes a semiconductor device with one or more transistors that include transistor gates that include conductive elements with cobalt silicide.

Turning now to FIG. 26, an electronic device 200 that includes a semiconductor device 202 with a transistor gate with a conductive element that comprises cobalt silicide is shown. The semiconductor device 202 may comprise a memory device, such as a DRAM device or a NAND flash memory device. Examples of electronic devices 200 that include NAND flash memory include, but are not limited to, portable digital music players (e.g., MP3, IPOD®, etc.), universal serial bus (USB) drives, removal storage cards, cellular telephones, cameras, and other electronic devices in which it is desirable to retain memory without power.

Although the foregoing description contains many specifics, these should not be construed as limiting the scope of the present invention, but merely as providing illustrations of some of the presently preferred embodiments. Similarly, other embodiments of the invention may be devised that do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein that fall within the meaning and scope of the claims are to be embraced thereby.

What is claimed is:
1. A semiconductor device comprising:
   transistors with transistor gates, each transistor gate comprising a conductive element including cobalt silicide, tantalum silicide, and polysilicon;
   a source region and a drain region proximate to each transistor gate of the transistor gates, the source region and the drain region spaced from the conductive element including cobalt silicide, tantalum silicide, and polysilicon; and
a gate oxide below the transistor gate, a first sidewall of the gate oxide laterally adjacent the source region and a second sidewall of the gate oxide laterally adjacent the drain region and the source region and the drain region not extending under the gate oxide.

2. The semiconductor device of claim 1, wherein the conductive element comprises the tantalum silicide beneath the cobalt silicide.

3. The semiconductor device of claim 2, wherein the tantalum silicide has a thickness of about 200 Å to about 300 Å.

4. The semiconductor device of claim 2, wherein the cobalt silicide has a thickness of about 300 Å to about 600 Å.

5. The semiconductor device of claim 2, wherein the conductive element comprises conductively doped polysilicon beneath the tantalum silicide.

6. The semiconductor device of claim 1, further comprising a dielectric material on spacers adjacent to sidewalls of the conductive elements.

7. The semiconductor device of claim 6, wherein the dielectric material is in contact with a portion of the source region and with a portion of the drain region.

8. The semiconductor device of claim 1, further comprising a dielectric material in contact with a portion of the source region and with a portion of the drain region.

9. The semiconductor device of claim 8, further comprising a cap over the conductive element and in contact with a portion of the dielectric material.

10. A transistor, comprising:
a transistor gate comprising:
a conductive element comprising cobalt silicide, tantalum silicide, and polysilicon; and
sidewall spacers adjacent to lateral edges of the conductive element;
a source region located adjacent to a first side of the transistor gate, the source region isolated from all cobalt including the cobalt silicide of the conductive element;
a drain region located adjacent to a second side of the same transistor gate, the drain region isolated from all cobalt including the cobalt silicide of the conductive element; and
a gate oxide below the transistor gate, a width of the gate oxide equal to a width of the conductive element and the sidewall spacers, wherein no portion of the gate oxide overlies the source region and the drain region and a first sidewall of the gate oxide is laterally adjacent the source region and a second sidewall of the gate oxide is laterally adjacent the drain region,
all silicide of the transistor contained in the transistor gate.

11. The transistor of claim 10, wherein the transistor gate comprises the tantalum silicide adjacent the cobalt silicide.

12. The transistor of claim 11, wherein the polysilicon comprises conductively doped polysilicon adjacent the tantalum silicide.

13. The transistor of claim 10, wherein the gate oxide underlies the conductive element.

14. The transistor of claim 10, wherein the gate oxide extends directly between the source region and the drain region.

15. An electronic device, comprising:
at least one semiconductor device comprising:
at least one transistor with a transistor gate comprising a conductive element including cobalt silicide and a gate oxide below the transistor gate, all silicide of the at least one transistor contained in the transistor gate, and a width of the conductive element less than a width of the gate oxide;
a source region and a drain region only laterally adjacent to each transistor gate; and
a dielectric material directly on the source and drain regions, the source and drain regions in contact with a contact plug extending through and in direct contact with the dielectric material.

16. The electronic device of claim 15, wherein the at least one semiconductor device comprises dynamic random access memory comprising the at least one transistor.

17. The electronic device of claim 15, wherein the at least one semiconductor device comprises a NAND flash memory device comprising the at least one transistor.

18. The electronic device of claim 15, wherein the conductive element further comprises tantalum silicide.

19. A semiconductor device comprising transistors, comprising:
transistor gates, each transistor gate comprising:
a conductive element comprising cobalt silicide; and
a gate oxide on a surface of a substrate on which the transistor gate is disposed, a width of the conductive element less than a width of the gate oxide;
source and drain regions on opposite sides of each transistor gate of the transistor gates, the source and drain regions physically isolated from all silicide material including the cobalt silicide of the conductive element; and
a dielectric material directly on the source and drain regions, the source and drain regions in contact with a contact plug extending through and in direct contact with the dielectric material.

20. The semiconductor device of claim 19, wherein the conductive element of each transistor gate further comprises tantalum silicide beneath the cobalt silicide.

21. The semiconductor device of claim 20, wherein the conductive element further comprises polysilicon beneath the tantalum silicide.

22. The semiconductor device of claim 19, wherein the dielectric material comprises at least one of doped silicon dioxide, borophosphosilicate glass, phosphosilicate glass, and borosilicate glass.

23. The semiconductor device of claim 19, wherein the conductive element is recessed relative to an upper surface of the dielectric material.

24. The semiconductor device of claim 19, wherein each transistor gate further comprises a transistor gate cap over the conductive element.

* * * * *